(12) United States Patent
Takeo et al.

(10) Patent No.: US 8,409,998 B2
(45) Date of Patent: Apr. 2, 2013

(54) METHOD OF MANUFACTURING VERTICAL-CAVITY SURFACE EMITTING LASER

(75) Inventors: Kageyama Takeo, Tokyo (JP); Norihiro Iwai, Tokyo (JP); Koji Hiraiwa, Tokyo (JP); Yoshihiko Ikenaga, Tokyo (JP)

(73) Assignee: Furukawa Electric Co., Ltd, Tokyo (JP)

( * ) Notice: Subject to any disclaimer, the term of this patent is extended or adjusted under 35 U.S.C. 154(b) by 576 days.

(21) Appl. No.: 12/570,834

(22) Filed: Sep. 30, 2009

(65) Prior Publication Data

US 2011/0076854 A1    Mar. 31, 2011

(51) Int. Cl.
*H01L 21/302* (2006.01)
(52) U.S. Cl. .................................. 438/745; 372/50.124
(58) Field of Classification Search .................... 438/745
See application file for complete search history.

(56) References Cited

U.S. PATENT DOCUMENTS

2005/0201436 A1* 9/2005 Collins ...................... 372/43.01
2007/0153861 A1* 7/2007 Collins et al. ............ 372/50.124

FOREIGN PATENT DOCUMENTS

JP    2007-258582    4/2009

OTHER PUBLICATIONS

Baratte et al, Gallium Arsenide Gate Field-Effect Transistor Process Utilizing Self-Aligned Epitaxial Contacts, Dec. 1, 1998, IBM Technical Disclosure Bulletin.*
C. Helms, I. Aeby, W. Luo, R. W. Herrick, A. Yuen, "Reliability of Oxide VCSELs at Emcore", Proc. SPIE, vol. 5364, pp. 183-189, 2004.

* cited by examiner

*Primary Examiner* — Binh X Tran
*Assistant Examiner* — David Cathey, Jr.
(74) *Attorney, Agent, or Firm* — Turocy & Watson, LLP

(57) ABSTRACT

According to a method of manufacturing a vertical-cavity surface-emitting semiconductor laser element in accordance with the present invention, a process of wet etching is performed for a part that is oxidized in a layer of an AlGaAs (42) which configures a layer having an index of refraction as lower and in which a composition of aluminum is designed to be as higher comparing to the other pairs of layers in a DBR mirror at an upper side that are formed at an inner side of a mesa post (38). And then a process of filling up again is performed with making use of a layer of polyimide (26). Moreover, an etchant that includes such as a hydrofluoric acid or a buffered hydrofluoric acid or an aqueous ammonia or the like is made use in order to perform such the process of wet etching.

3 Claims, 5 Drawing Sheets

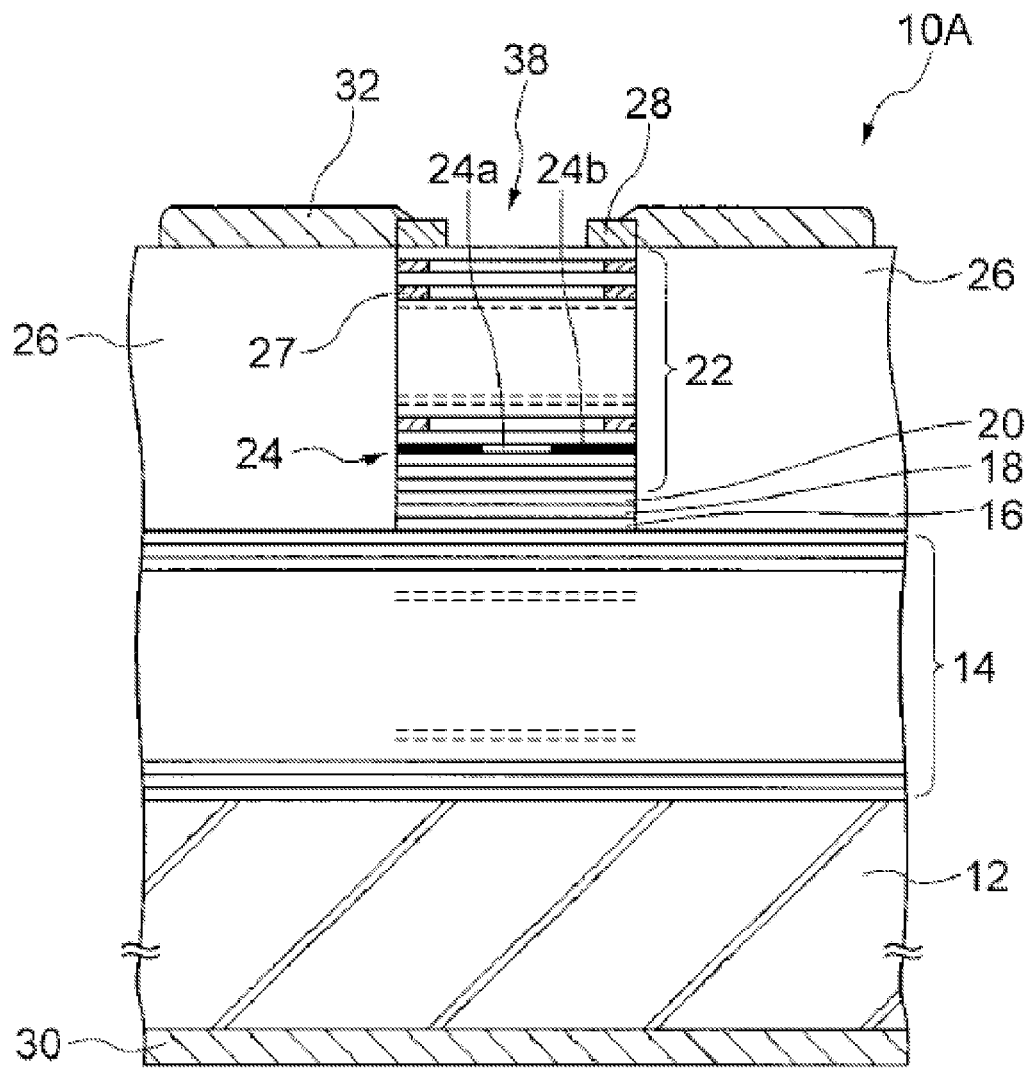

12: SUBSTRATE OF n-GaAs
14: DBR MIRROR AT THE LOWER SIDE
16: CLADDING LAYER AT THE LOWER SIDE
18: ACTIVE LAYER OF QUANTUM WELL
20: CLADDING LAYER AT THE UPPER SIDE
22: DBR MIRROR AT THE UPPER SIDE
24: ELECTRICAL CURRENT NARROWING LAYER
    24A: OPEN PART FOR ELECTRICAL CURRENT
    24B: REGION FOR NARROWING ELECTRICAL CURRENT
26: LAYER OF POLYIMIDE
28: ELECTRODE AT THE (p) SIDE
30: ELECTRODE AT THE (n) SIDE
32: PAD FOR ELECTRODE
38: MESA POST

PRIOR ART

FIG. 5

METHOD OF MANUFACTURING VERTICAL-CAVITY SURFACE EMITTING LASER

BACKGROUND OF THE INVENTION

1. Field of the Invention

The present invention relates to a method of manufacturing a vertical-cavity surface-emitting semiconductor laser element, and more specifically to a method of manufacturing a vertical-cavity surface emitting semiconductor laser element as a type of narrowing an oxidized layer, that comprises a mesa post in which a structure of a resonator in a vertical direction is designed to be formed in a direction as vertical to a substrate, and that is superior in a reliability.

2. Description of the Related Art

A vertical-cavity surface-emitting semiconductor laser element (VCSEL: referred to as a surface emitting laser element hereinafter) is a semiconductor laser element that is designed to emit a light in a direction as orthogonal to a substrate. Moreover, in accordance with such the surface emitting laser element, it becomes possible to array laser elements as plurality thereof in a two dimensional array formation on to a same substrate therefor. Further, an attention is becoming to be paid to such the surface emitting laser element as a source of light for a usage of a communication, or as a device for a usage of any other applications as a variety thereof. Furthermore, a demand of such the surface emitting laser element is becoming to be increased mainly for a usage of a source of a signal for a high speed optical transmission in particular regarding a data com transmission such as a giga bit Ethernet™ or a fiber channel or the like.

Here, FIG. 5 is a cross sectional view for showing a configuration of a conventional vertical-cavity surface-emitting semiconductor laser element that is disclosed in the following Patent Document 1. And, such a vertical-cavity surface-emitting semiconductor laser element (10A) comprises: a laser structure in which distributed Bragg reflector (DBR) mirrors of (14) and (22) as one pair thereof are designed to be formed, that is formed of a multilayered film layer of a semiconductor on to a substrate of a semiconductor (12), such as a GaAs or an InP or the like; and an active layer (18) and a cladding layer at a lower side thereof (16) and a cladding layer at an upper side thereof (20) that are designed to be as a region for emission between such the DBR mirrors of (14) and the (22) as the one pair thereof. Moreover, such the element (10A) further comprises an electrical current narrowing layer (24) (a narrowing layer by oxidizing) in order to enhance an efficiency of an electrical current through such the active layer (18) and then in order to reduce a threshold electrical current for an oscillation. Further, the electrical current narrowing layer (24) is designed to be comprised of a layer of an AlAs, and then the same comprises: an inhibition region from an electrical current (24B) for which a periphery of such the layer of the AlAs is designed to be oxidized; and a region for injecting an electrical current (an open part for the electrical current) (24A) that is designed to be remained at a central part as a region which is not designed to be oxidized. Still further, the DBR mirrors of (14) and the (22) is designed to be made use of a plurality of pairs of layers, such as a layered structure of Al(Ga)As/AlGaAs or the like as a system of a GaAs for example.

Still further, it is able to design for such the surface emitting semiconductor laser element of the vertical cavity type (10A) to be formed on to a substrate of a GaAs. Still further, it is able to design to make use of a DBR mirror that is formed of a system of an AlGaAs which is superior in a thermal conductivity thereof and has a ratio of reflectance as higher. And then such the element (10A) becomes to have a good prospect as a laser element by which becoming able to emit a laser light of a band between 0.8 μm and 1.0 μm.

Furthermore, such a surface emitting semiconductor laser element becomes to have a good prospect as a laser element, in which the active layer (18) is designed to be formed with making use of a material of a GaInNAs system, thereby becoming able to emit a laser light of a band in a long wave length that is between 1.2 μm and 1.6 μm.

Here, it is known that a volume of the layer of the AlAs becomes to be retracted at a period of performing a process of forming the electrical current narrowing layer (24) by performing an oxidation of the layer of the AlAs in accordance with the vertical-cavity surface emitting semiconductor laser element as the type of narrowing the oxidized layer which is described above, and then that a stress in the layer of the compound semiconductor becomes to be occurred which is adjacent to such the electrical current narrowing layer (24). And then due to such the stress to be occurred, because the active layer (18) is designed to be located in a vicinity of such the electrical current narrowing layer (24), it becomes to be occurred the following problems that a damage becomes to be occurred on to such the active layer (18), and then that a life time of such the element becomes to be shorter. And therefore making use of a layer of an $Al_{0.98}Ga_{0.02}As$ is proposed, that includes gallium (Ga) with a small amount thereof in place of the layer of the AlAs for such the electrical current narrowing layer (24) in order to prevent from shortening the life time of such the element. Moreover, an effort is given to reduce such the stress that is generated due to the retraction of the volume at a time of performing a conversion into such the electrical current narrowing layer (24), by designing for such the layer of the AlAs to have a thickness of approximately 40 nm as thinner.

In the meantime, the multilayered film layer that configures the DBR mirror becomes to be exposed as well to a condition of oxidation as stronger which is similar to that for such the layer of the AlAs. And hence it is occurred a problem that it cannot help but be oxidized a layer of an $Al_{0.9}Ga_{0.1}As$ to become as an annular shape along the periphery of the mesa post, that is shown with making use of the symbol (27) in FIG. 5, that is designed to be as a layer in which a composition of Al is higher, that is to say, that is to be as the layer having the index of refraction as lower among the pairs of the layers that configure the DBR mirror at the upper side (22).

Moreover, such the oxidized part (27) that becomes to be formed due to an oxidation at an inner side of the DBR mirror has a width of approximately a few hundreds of nanometers for example, that of course further depends on such as a composition or a thickness or the like as well regarding a layer of a compound semiconductor which configures such the DBR mirror. And then for each of the layers of the AlGaAs that individually configure such the DBR mirror a designing is performed to have a layer thickness to be λ/4n as relatively thicker with corresponding to a wave length of the laser light that is defined here to be as the λ, though such a degree of the oxidation as a few hundreds of nanometers is relatively smaller from a point of view of a diameter of a mesa post (38). Further, such the DBR mirror is designed to have the number of pairs as large in addition to such the layer thickness of the DBR mirror as relatively thicker. And hence the retraction of the volume of the oxidized part becomes to be so much larger that it cannot be negligible comparing to the other part at an inner side of such the surface emitting semiconductor laser element of the vertical cavity type even that has the width of just a few hundreds of nanometers. And therefore a development of such as a surface emitting semiconductor laser element of the vertical cavity type or the like is performed as well, that is designed to comprise a DBR mirror in which a layer having an index of refraction as lower that is a layer containing Al as higher is designed to have a ratio of composition of Al with being suppressed within a predetermined ratio, in order to prevent the inner side of such the DBR mirror from any occurrence of the oxidation.

[Patent Document 1] Japanese Patent Application Publication No. 2007-258582

[Nonpatent Document 1] C. Helms, I. Aeby, W. Luo, R. W. Herrick, A. Yuen, "Reliability of Oxide VCSELs at Emcore", Proc. SPIE, vol. 5364, pp. 183-189, 2004

Moreover, a problem on a reliability of a random failure (an unexpected sudden failure) is inhered in such a vertical-cavity surface emitting semiconductor laser element as the type of narrowing the oxidized layer. And then it is known that a cause is mainly a stress due to an oxidation of a part that is not intended at the period of the process of the selective oxidation that is described above. Moreover, it can be considered for such the cause that a variation of the volume becomes to be occurred in accordance with such the surface emitting semiconductor laser element of the vertical cavity type due to the cause of the oxidation of the layer having the index of refraction as lower in the DBR mirror, that a stress which is generated due to such the variation of the volume becomes to effect as negatively on to the active layer, and then that a dislocation becomes to be generated on an end face of such the active layer at a lateral face of the mesa post. And then in accordance with such the surface emitting semiconductor laser element of the vertical cavity type, such the dislocations that are generated at a period of performing the manufacturing becomes to be increased even to the region for emitting at the central part of the mesa post. And hence such the region for emitting becomes to include defects, and then thereby resulting in to the random failure.

Here, it can be mentioned that it may be effective by making use of a layer of a semiconductor in which a layer having an index of refraction as lower is designed to have an Al content with being suppressed in order to suppress such the occurrence of the oxidation of the DBR mirror. However, the index of refraction of the layer containing Al regarding a semiconductor layer of the AlGaAs system is different with corresponding to a ratio of an Al composition. And thus there is a demand as larger in order to design such a difference of the index of refraction between a layer having an index of refraction as higher and the layer having the index of refraction as lower by designing to change the ratio of the component of Al respectively, and then in order to form a DBR mirror that is designed to have a ratio of reflectance as higher. In the meantime, however, it is not able to enhance such the difference of the index of refraction between the layer having the index of refraction as higher and the layer having the index of refraction as lower in a case where the content of Al in such the layer of the AlGaAs is designed to be suppressed as lower. And then thereby becoming indispensable to design for the number of the pairs of the layered film layers to be increased in order to form a reflecting mirror that is designed to have a predetermined ratio of reflection. In the meantime, however, it is not desirable to increase such the number of the pairs of the layered film layers as too many from a point of view of such as a property of a heat radiation or a property of a light transmission or a manufacturing cost or the like.

Moreover, in accordance with such the surface emitting semiconductor laser element of the vertical cavity type that is disclosed in the above Patent Document 1, it is disclosed that a layer of a compound semiconductor that has a content of Al as lower is designed to be formed at a part for forming a layered film layer in a vicinity of an active layer therein among the layered film layers that individually configure a DBR mirror, in the meantime, that another layer of a compound semiconductor that has a content of Al as higher is designed to be formed at a part for forming a layered film layer which is far from such the active layer on the contrary. And then according to such the configuration in such a manner, it becomes able to reduce an amount of the distortions that become to be applied from such the part for forming the layered film layer in the vicinity of the active layer to such the active layer. Further, it becomes able to reduce the number of the total layers regarding such the layered film layer that is designed to configure such the DBR mirror, and then it becomes able to suppress the increase in the number of the pairs of such the layered film layer by adopting the layer of the compound semiconductor that has the content of Al as higher, in order to form such the layered film layer that has the stress due to the distortion as relatively smaller which might effect as negatively on to the active layer and that is designed to be located as far from such the active layer. However, an advantage is obtained as limiting somehow by making use of such the method that is disclosed in such the above Patent Document 1.

In the meantime, a configuration is disclosed in the above Nonpatent Document 1 in order to remove a peripheral part of a mesa post for an oxidized layer having an index of refraction as lower. However, there is no disclosure at all regarding any process of removing such the part as more specifically to a method in such the document.

And therefore the present invention is provided with having a regard to the description as above, and an objective is to provide a method of manufacturing a vertical-cavity surface-emitting semiconductor laser element which is characterized in that it becomes able to perform a process of removing as effectively a part that will be oxidized in a DBR mirror in order to suppress a stress that effect as negatively on to an active layer due to a cause of any occurrence of the oxidation in such the DBR mirror at a period of manufacturing such a surface emitting semiconductor laser element that comprises a mesa post.

SUMMARY OF THE INVENTION

In order to accomplish the objective that is described above, a vertical-cavity surface-emitting semiconductor laser element in accordance with the present invention is characterized in that such the surface emitting semiconductor laser element of the vertical cavity type comprises a reflecting mirror of a multilayered film layer which is comprised of a layered film layer of a compound semiconductor which includes aluminum and which is designed to be formed as a mesa post, and that further comprises a selectively oxidized electrical current narrowing layer which is designed to be formed in a vicinity of such the reflecting mirror of the multilayered film layer or to be formed in such the reflecting mirror of the multilayered film layer and which includes an $Al_xGa_{1-x}As$ (x>0.9).

Moreover, according to a method of manufacturing the surface emitting semiconductor laser element of the vertical cavity type in accordance with the present invention, it becomes able to provide a process of manufacturing a vertical-cavity surface emitting semiconductor laser element of an electrical current injection type which is characterized in that comprises the following steps of: performing a process of a selective oxidation in order to produce the selectively oxidized electrical current narrowing layer; and then removing as selectively by making use of a process of wet etching for a part in the layered film layer of the DBR mirror that is oxidized in the period of the process of the selective oxidation.

Furthermore, according to a method of manufacturing the surface emitting semiconductor laser element of the vertical cavity type in accordance with the present invention, it becomes able to obtain an improvement on a reliability of the surface emitting semiconductor laser element of the vertical cavity type that becomes to be obtained in the following manner, because a part that is oxidized becomes to be removed as effectively due to an adoption of such the process of wet etching and due to an adoption of a configuration in order to remove such the part that is oxidized at an inner side of the DBR mirror.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 5 is a cross sectional view showing a conventional vertical-cavity surface-emitting semiconductor laser element.

DETAILED DESCRIPTION OF THE PREFERRED EMBODIMENTS

Figure 1:
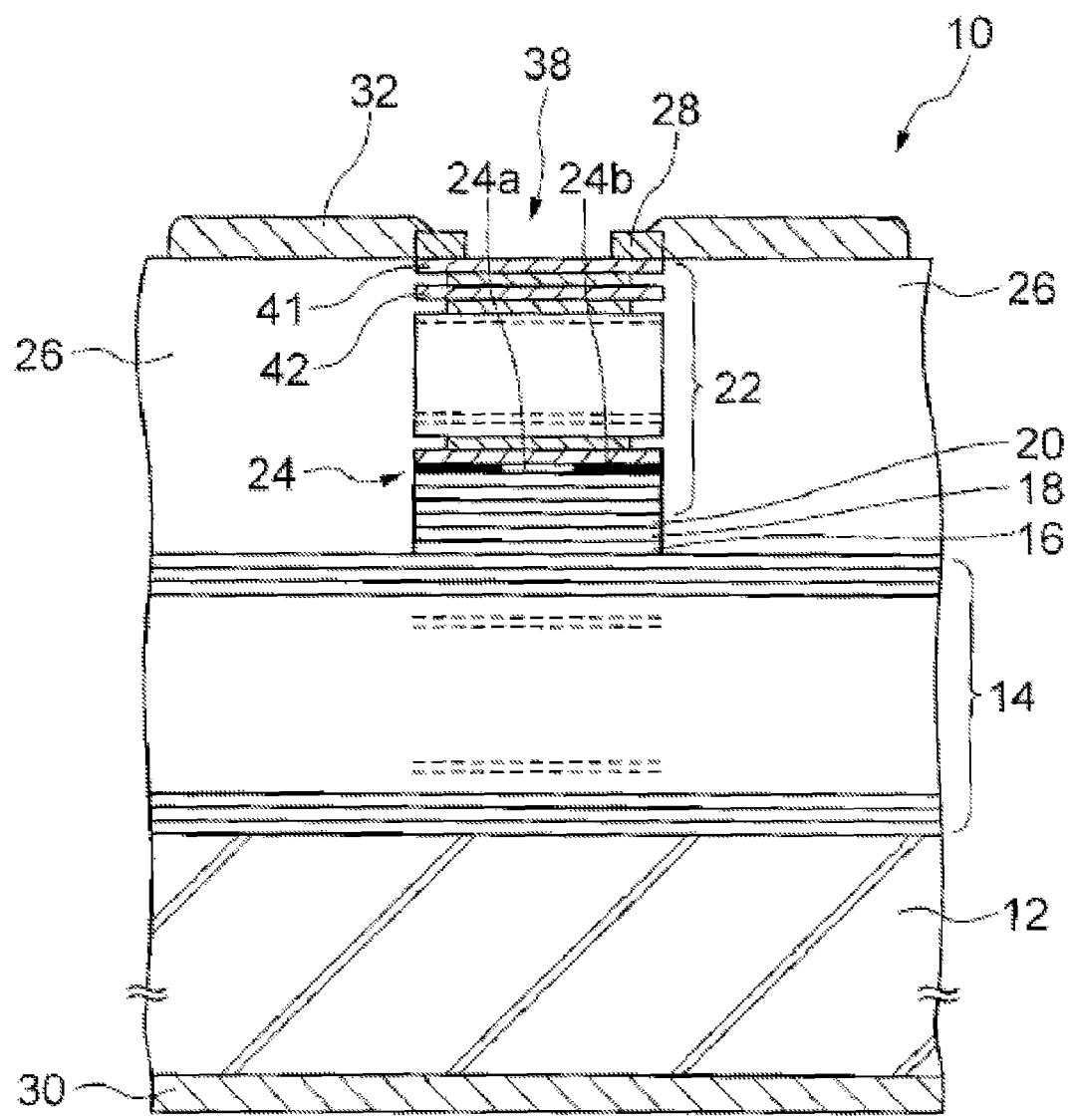
FIG. 1 is a cross sectional view showing a vertical-cavity surface-emitting semiconductor laser element by making use of a method of manufacturing in one embodiment in accordance with the present invention.

Hereinafter an embodiment in accordance with the present invention will be described as exemplarily in detailed below in reference to FIG. 1. And then in accordance with FIG. 1 a vertical-cavity surface-emitting semiconductor laser element (10) comprises a structure of a layered film layer on to a substrate of an n-GaAs (12), that is configured of: a DBR mirror at a lower side (14) that comprises a structure of n-$Al_{0.9}Ga_{0.1}As$/n-$Al_{0.2}Ga_{0.8}As$ as thirty-five pairs in which each of such the layers is designed to have a thickness of $\lambda/4n$ respectively (here the $\lambda$ is defined to be as a wave length of emission, and the n therein is defined to be as an index of refraction); a cladding layer at a lower side (16); an active layer of a quantum well (18); a cladding layer at an upper side (20); and a DBR mirror at an upper side (22) that comprises a structure of p-$Al_{0.9}Ga_{0.1}As$/p-$Al_{0.2}Ga_{0.8}As$ as twenty-five pairs in which each of such the layers is designed to have a thickness of $\lambda/4n$ respectively.

Moreover, in accordance with such the DBR mirror at the upper side (22), one layer that is close to the active layer of the quantum well (18) is designed to be comprised of a layer of an AlAs in place of the layer of the $Al_{0.9}Ga_{0.1}As$. Further, aluminum in such the layer of the AlAs is designed to be oxidized as selectively at a region as a periphery of but except a region for injecting an electrical current (24A) at a central part. And then such the aluminum becomes to configure an electrical current narrowing layer (24) that becomes to be comprised of a layer of an aluminum oxide.

Still further, a process is designed to perform on such the DBR mirror at the upper side (22) in order to form a mesa post (38) of a round shape from a lower side of the electrical current narrowing layer (24) through the layer which is close to the active layer of the quantum well (18), that is designed to have a diameter of approximately thirty micrometers for example, by making use of a process of photolithography and a process of etching. Still further, such the electrical current narrowing layer (24) becomes to be formed that has an open part for an electrical current (24A) at a center part and an inhibition region from an electrical current (24B) at a periphery, by performing a process of an oxidation of the layered film layer structure that is formed into the mesa post (38) at a temperature of approximately 400° C. in an ambient atmosphere of water vapor, and then by performing the oxidation as selectively the Al in the layer of the AlAs from an outer side of such the mesa post (38).

Still further, such the mesa post (38) is designed to be filled up at a periphery with making use of such as a layer of a polyimide (26) or the like. Still further, an electrode of a ring shape is designed to be provided as an electrode at a (p) side (28) with having a width of approximately between five micrometers and ten micrometers on to such the mesa post (38). Still further, an electrode at an (n) side (30) is designed to be formed at a rear surface of the substrate of the n-GaAs (12), after performing an adjustment of a thickness of such the substrate to be as approximately 200 μm for example, by performing a process of polishing as properly for such the rear surface of the substrate. Furthermore, a pad for the electrode (32) is designed to be formed on to such the layer of the polyimide (26) so as to contact to the electrode of the ring shape (28) in order to connect to an external terminal with making use of a wire.

In the meantime, each of the pairs of the layers at the inner side of the DBR mirror at the upper side (22) is designed to be performed a process of etching for a layer of the $Al_{0.9}Ga_{0.1}As$ (42) that is designed to be as the layer having the index of refraction as lower that is formed to be as an annular shape at a side of the periphery of the mesa post (38). And in the meantime, a layer of the $Al_{0.2}Ga_{0.8}As$ (41) that is the layer having the index of refraction as higher is designed to be remained without being etched on the contrary due to a property of withstanding against the oxidation. Here, FIG. 2 is a cross sectional view for showing with enlarging an end part of such the DBR mirror at the upper side (22) that is shown in FIG. 1.

Moreover, in accordance with such the DBR mirror at the upper side (22), the layer of the $Al_{0.9}Ga_{0.1}As$ (42) that is the layer having the index of refraction as lower becomes to be oxidized for having the annular shape due to the process of the oxidation in order to form the electrical current narrowing layer (24), and then the volume of such the oxidized part becomes to be retracted, and hence the same becomes to exert the stress on to the active layer (18), that are described above. And therefore in accordance with the present embodiment, such the oxidized part is designed to be removed as annular shape by performing a process of wet etching that is designed to be performed after performing the process of the oxidation in the ambient atmosphere of water vapor. Moreover, such a part (43) that is removed by performing the process of etching is designed to be filled up after such the process with making use of the layer of the polyimide (26). And thus due to such the configuration it becomes able to reduce the stress that exerts on to such the active layer (18), and then it becomes able to avoid from the occurrence of any random failure.

Here, the $Al_xGa_{1-x}As$ is made use for the selectively oxidized electrical current narrowing layer in which there is designed for the (x) to be as 0.9, that is to say, the $Al_{0.9}Ga_{0.1}As$ is made use. However, it is further preferable for such the (x) to be as not less than 0.95 from a point of view of a ratio of the selective oxidation comparing to that for the reflecting mirror of the multilayered film layer.

Next, the process of wet etching is designed to be performed as the following description, that will be performed after performing the process of the oxidation of the mesa post (38).

That is, it is preferred for an etching reagent (etchant) in order to perform the process of such the wet etching with making use of a solution that contains a hydrofluoric acid and/or an aqueous ammonia. As more specifically, it is preferred to make use of such as the aqueous ammonia, or an etchant that contains the aqueous ammonia (it is desirable for such the ammonia to have a concentration of approximately between ten percent and fifty percent, or it is further preferable to be as between twenty percent and forty percent), or the hydrofluoric acid, or a buffered hydrofluoric acid (BHF) which is a solution that contains an ammonium fluoride and the hydrofluoric acid (such as a solution that contains the hydrofluoric acid and the ammonium fluoride or the like as approximately twenty percent for each respectively), or an etchant that contains the hydrofluoric acid, or the like. Moreover, it is easy to find out a trace that is caused by removing due to such the process of the wet etching, and then it is possible to observe and then to confirm by making use of such as a scanning electron microscope (SEM) or a focused ion beam scanning ion microscope (FIB-SIM) or the like.

Here in order to complete the present invention, the structure that is disclosed in the Nonpatent Document 1 and that is mentioned above is designed to be formed by making use of the following processes as a variety of. And then in the first instance a process is tried in order to remove the oxidized part (27) at the inner side of the DBR mirror that is shown in FIG. 5 by making use of a process of dry etching, such as a dry etching with making use of a system of chloride or the like. However, it becomes to be found out that such the oxidized part becomes to be a mask as potently against such the process of the dry etching with making use of the system of chloride, and then that only the other part of the semiconductor becomes to be etched, and hence that the oxidized part that is required to be removed away becomes to be remained as a ring shape. And then as eventually it becomes to be found out that it becomes able to remove as effectively such the oxidized part by performing the process of the wet etching with making use of such the etching reagent that is mentioned above, in which such the substance is designed to be agitated at a room temperature with making use of such the etching reagent, such as the BHF or the like, and then after such the process a process of cleaning is designed to be performed with making use of a demineralized water. And thus in accordance with such the surface emitting semiconductor laser element of the vertical cavity type in which such the oxidized part is performed to be removed in such the manner, it becomes able to obtain a result as excellently regarding a test of the reliability.

Figure 3:
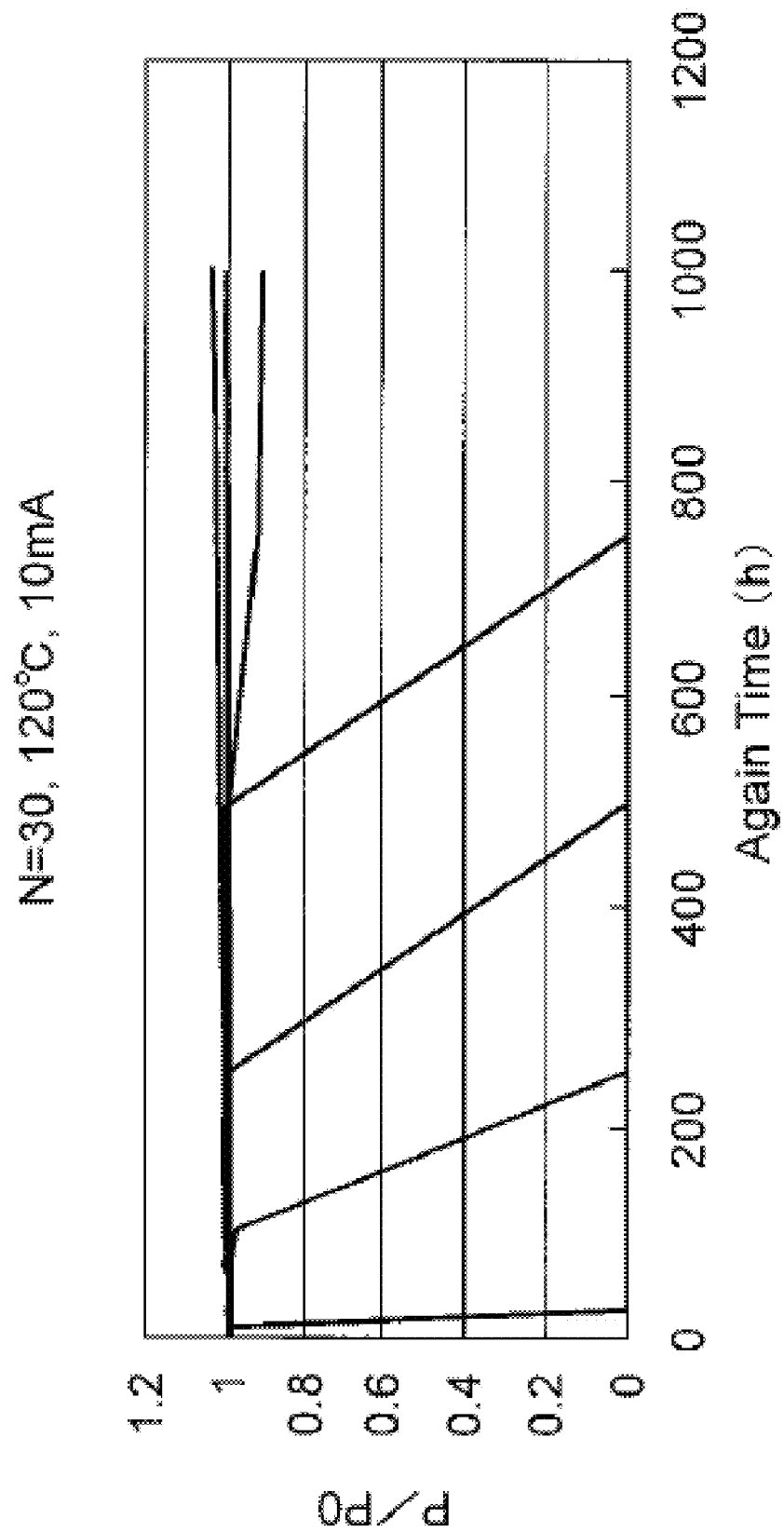
FIG. 3 is a graph showing a result of a reliability test for a conventional vertical-cavity surface-emitting semiconductor laser element.
Figure 4:
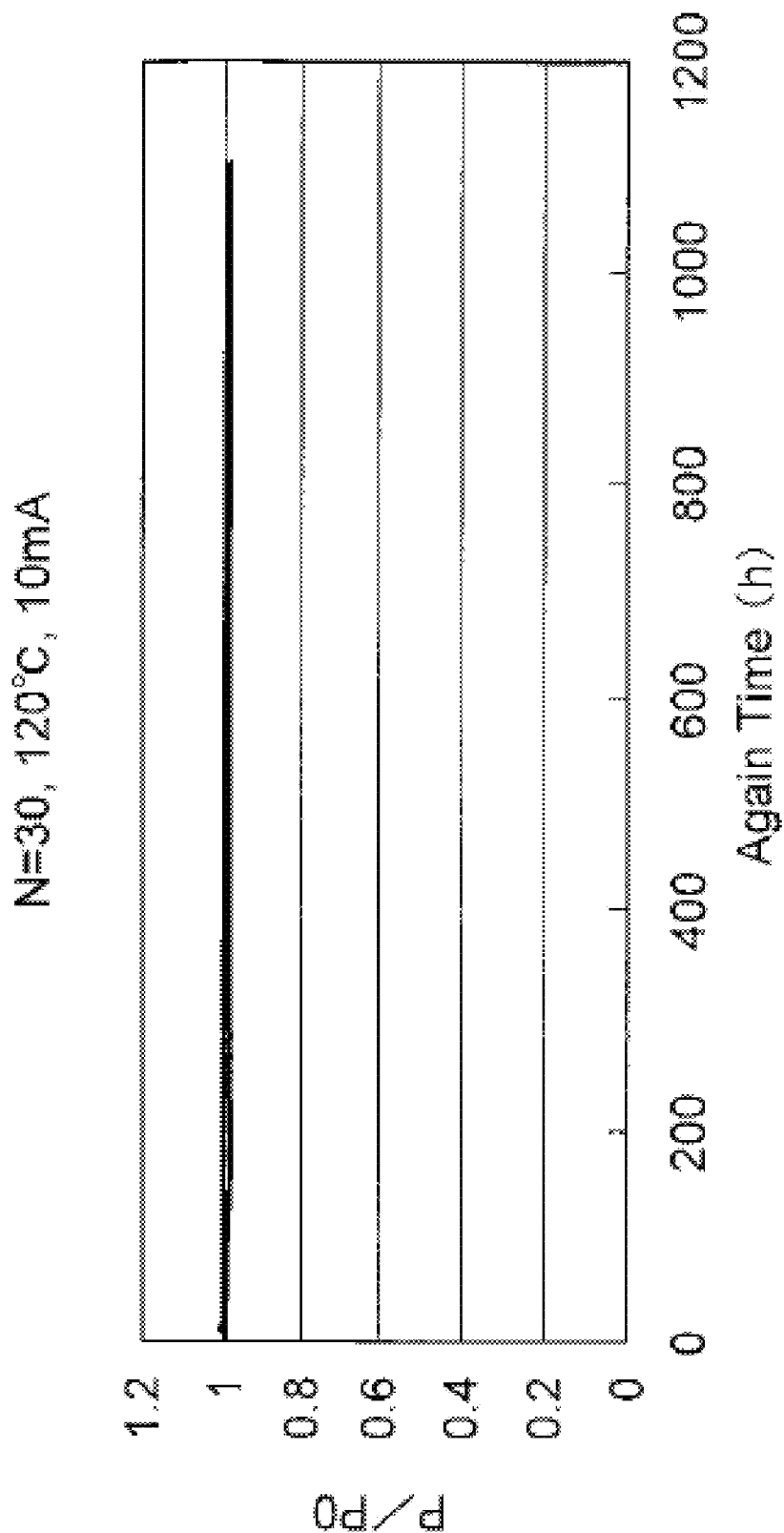
FIG. 4 is a graph showing a result of a reliability test for a vertical-cavity surface-emitting semiconductor laser element that is manufactured by making use of the method of manufacturing in accordance with the present invention.

For example, FIG. 3 shows a result of the reliability test for a conventional vertical-cavity surface-emitting semiconductor laser element in which any oxidized part is not designed to be removed at all, and in the meantime, FIG. 4 shows the result of the reliability test for the surface emitting semiconductor laser element of the vertical cavity type in which such the oxidized part is performed to be removed by making use of such the processes in accordance with the present invention. Moreover, such the test for each of the reliability is designed to be performed by making use of a method of an accelerated test at a temperature as higher after performing a process of a burn-in. Further, a condition is adopted for such the accelerated test in which the temperature is controlled to be as approximately 120° C., and in which an electrical current for operating is designed to be set as approximately ten milliamperes that is an auto current control (ACC). Still further, such the test is designed to be performed with making use of thirty pieces for such the two types of the elements respectively.

Still further, a relative value of an optical output as (P/P0) is designed to plot at every moment in time for each of the measurement in accordance with each of FIG. 3 and FIG. 4 respectively, in which an optical output immediately after performing the process of the burn-in at a room temperature is assumed to be as (P0), and an optical output at every moment in time for each of the measurements is assumed to be as (P), respectively. And hence it is found out that in accordance with the conventional surface emitting semiconductor laser element of the vertical cavity type a glide dislocation is occurred which may be considered due to a cumulative distortion in the oxidized part in the DBR mirror in a period of such the test of the reliability, and then that some elements are observed in which the individual laser oscillations become to be stopped in such the period.

Furthermore, in such the case where any glide dislocation is existing, the dislocations becomes to be proliferated from a lateral part of the mesa post on a plain surface of the active layer with making use of a carrier to be as an energy that is excited due to a emitted light as spontaneously from a part for emitting, and then such the laser oscillation becomes to be stopped at a same time when any of such the dislocations becomes to reach such the part for emitting. And hence due to such the cause, there are found out that four pieces of elements among the thirty in total become to be out of order in such the period of the test of the reliability, that is shown in FIG. 3.

In the meantime, in accordance with the surface emitting semiconductor laser element of the vertical cavity type on the contrary for which the method of manufacturing in accordance with the present invention is designed to be adopted, there is not found out any element at all among the thirty pieces in total in which the laser oscillation becomes to be decreased or the laser oscillation becomes to be stopped in the period of such the test of the reliability, that is shown in FIG. 4. And therefore the following purport becomes to be confirmed that it becomes able to improve the reliability of such the surface emitting semiconductor laser element of the vertical cavity type in which the oxidized part at the inner side of the DBR mirror is designed to be removed by making use of the method to perform such the processes in accordance with the present invention.

Here in accordance with the embodiment that is described above, the example is mentioned in which the DBR mirror at the upper side is designed to be configured with making use of the semiconductor as the (p) type. In the meantime, however, it is possible to select as properly a type of the electrical conduction regarding such the DBR mirror.

And thus the present invention is described in reference to the embodiment that is preferred thereto. In the meanwhile, however, such the method of manufacturing the surface emitting semiconductor laser element of the vertical cavity type in accordance with the present invention will not be limited only to such the configuration in accordance with the embodiment that is described above. And then any other methods in which any modification and/or any alteration will be applied to such the configuration in accordance with the embodiment that is described above will be included within the scope of the present invention.

Although the invention has been described with respect to specific embodiments for a complete and clear disclosure, appended claims are not to be thus limited but are to be construed as embodying all modifications and alternative constructions that may occur to one skilled in the art that fairly fall within the basic teaching herein set forth.

Figure 2:
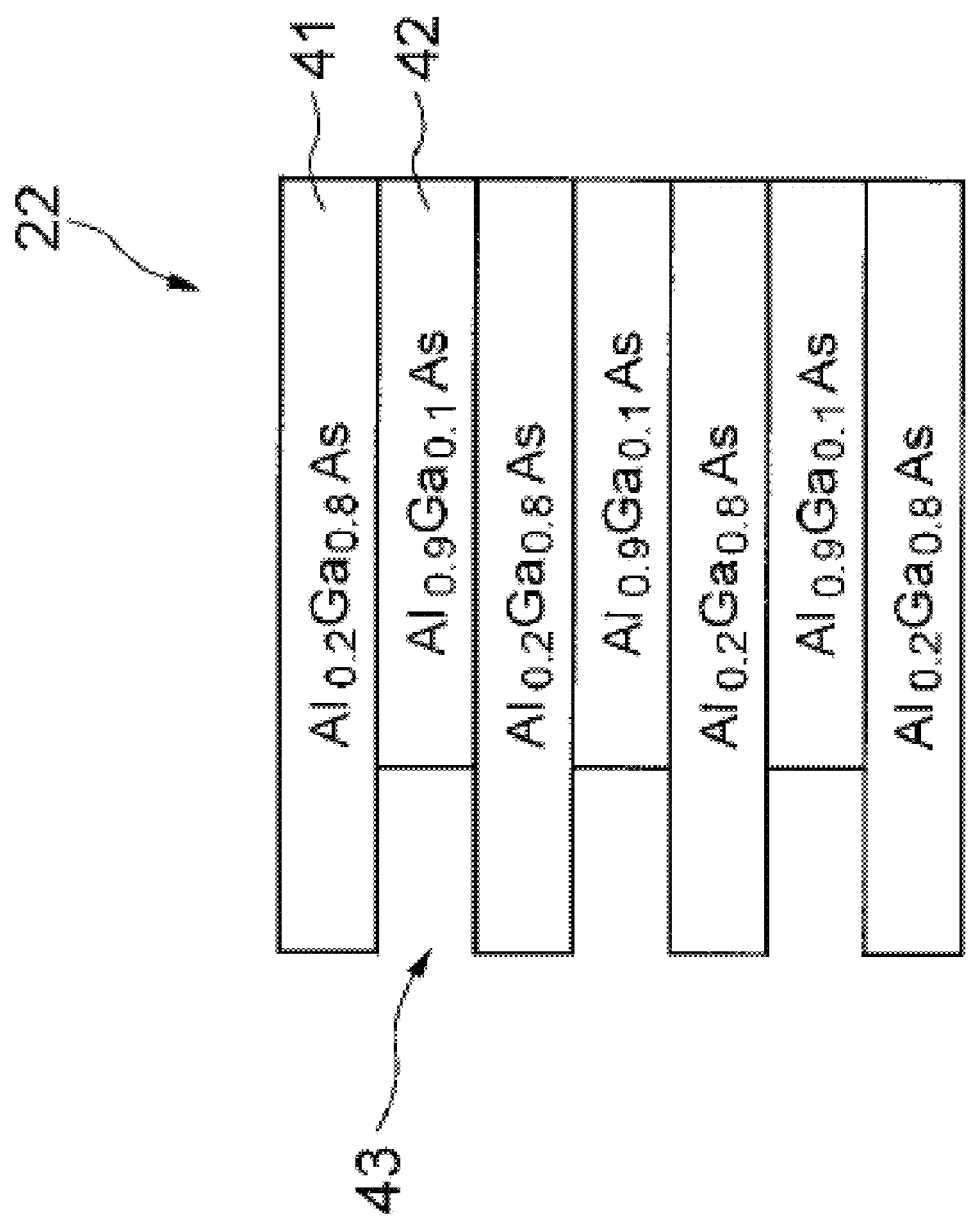
FIG. 2 is a detail drawing from a cross sectional point of view showing a DBR mirror at an upper side of the surface emitting semiconductor laser element of the vertical cavity type that is shown in FIG. 1.

The following reference descriptions apply to FIG. 1
12: SUBSTRATE OF n-GaAs
14: DBR MIRROR AT THE LOWER SIDE
16: CLADDING LAYER AT THE LOWER SIDE
18: ACTIVE LAYER OF QUANTUM WELL
20: CLADDING LAYER AT THE UPPER SIDE
22: DBR MIRROR AT THE UPPER SIDE
24: ELECTRICAL CURRENT NARROWING LAYER
  24A: OPEN PART FOR ELECTRICAL CURRENT
  24B: INHIBITION REGION FROM ELECTRICAL CURRENT
26: LAYER OF POLYIMIDE
28: ELECTRODE AT THE (p) SIDE
30: ELECTRODE AT THE (n) SIDE
32: PAD FOR ELECTRODE
38: MESA POST The following reference descriptions apply to FIG. 5
12: SUBSTRATE OF n-GaAs
14: DBR MIRROR AT THE LOWER SIDE
16: CLADDING LAYER AT THE LOWER SIDE
18: ACTIVE LAYER OF QUANTUM WELL
20: CLADDING LAYER AT THE UPPER SIDE
22: DBR MIRROR AT THE UPPER SIDE
24: ELECTRICAL CURRENT NARROWING LAYER
  24A: OPEN PART FOR ELECTRICAL CURRENT
  24B: REGION FOR NARROWING ELECTRICAL CURRENT
26: LAYER OF POLYIMIDE
28: ELECTRODE AT THE (p) SIDE
30: ELECTRODE AT THE (n) SIDE
32: PAD FOR ELECTRODE
38: MESA POST

What is claimed is:

1. A method of manufacturing a vertical-cavity surface emitting semiconductor laser element of an electrical current injection type that comprises a reflecting mirror of a multilayered film layer in which at least one first layer, having an index of refraction as lower than at least one second layer of the multilayered film layer having a higher index of refraction, is comprised of a layered film layer of a compound semiconductor which includes aluminum and which is formed to be as a mesa post, and that further comprises a selectively oxidized electrical current narrowing layer which is formed in a vicinity of the reflecting mirror of the multilayered film layer or the same is formed in the reflecting mirror of the multilayered film layer and which includes and $Al_xGa_{1-x}As$ (a>0.9), comprising the steps of:

performing a process of a selective oxidation in order to produce said selectively oxidized electrical current narrowing layer;

removing as selectively by making use of a process of wet etching for a part in the layered film layer of the reflecting mirror of the multilayered film layer that is oxidized at said process of said selective oxidation, wherein the process of wet etching includes selectively etching at least one etched gap in the at least one first layer having the index of refraction as lower thereby forming at least one annular ring defined by the at least one etched gap; and filling the at least one etched gap with a layer of polyimide material.

2. The method of manufacturing the surface semiconductor laser element of the vertical cavity type according to claim 1, wherein an etching reagent that includes a hydrofluoric acid and/or an ammonium hydroxide is made use in order to perform said process of wet etching.

3. The method of manufacturing the surface emitting semiconductor laser element of the vertical cavity type according to claim 1 or 2, wherein said process of wet etching is performed in order to remain a part that is oxidized in said selectively oxidized electrical current narrowing layer.

* * * * *